United States Patent
Xie et al.

(10) Patent No.: US 12,088,312 B2
(45) Date of Patent: Sep. 10, 2024

(54) IMPLEMENTATION METHOD AND DEVICE OF ATOMIC CLOCK BASED ON DIAMOND NV-$^{14}$N COUPLING SPIN SYSTEM

(71) Applicant: UNIVERSITY OF SCIENCE AND TECHNOLOGY OF CHINA, Anhui (CN)

(72) Inventors: Tianyu Xie, Anhui (CN); Shaoyi Xu, Anhui (CN); Zhiyuan Zhao, Anhui (CN); Fazhan Shi, Anhui (CN); Jiangfeng Du, Anhui (CN)

(73) Assignee: University of Science and Technology of China, Anhui (CN)

( * ) Notice: Subject to any disclaimer, the term of this patent is extended or adjusted under 35 U.S.C. 154(b) by 0 days.

(21) Appl. No.: 18/029,448

(22) PCT Filed: Jun. 7, 2021

(86) PCT No.: PCT/CN2021/098720
§ 371 (c)(1),
(2) Date: Mar. 30, 2023

(87) PCT Pub. No.: WO2022/256990
PCT Pub. Date: Dec. 15, 2022

(65) Prior Publication Data
US 2023/0370075 A1    Nov. 16, 2023

(51) Int. Cl.
*H03L 7/26*    (2006.01)
*G04F 5/14*    (2006.01)

(52) U.S. Cl.
CPC . *H03L 7/26* (2013.01); *G04F 5/14* (2013.01)

(58) Field of Classification Search
CPC ................................. H03L 7/26; G04F 5/14
See application file for complete search history.

(56) References Cited

U.S. PATENT DOCUMENTS

| | | |
|---|---|---|
| 4,943,955 A | 7/1990 | Rabian et al. |
| 2013/0003766 A1 | 1/2013 | Savchenkov et al. |

(Continued)

FOREIGN PATENT DOCUMENTS

| | | |
|---|---|---|
| CN | 205808419 | 12/2016 |
| CN | 106773612 | 5/2017 |
| CN | 112068046 | 12/2020 |

OTHER PUBLICATIONS

International Search Report and Written Opinion in International Appln. No. PCT/CN2021/098720, mailed on Mar. 2, 2022, 13 pages (with machine English translation).

*Primary Examiner* — Jeffrey M Shin
(74) *Attorney, Agent, or Firm* — Fish & Richardson P.C.

(57) ABSTRACT

A method for implementing an atomic clock based on NV-$^{14}$N coupling spin system in diamond and a device are provided. The method is to lock a RF frequency using a $^{14}$N zero-field splitting and output the RF frequency as a frequency standard. The method includes: applying a pulse sequence to jointly initialize NV electron spins and $^{14}$N nuclear spins; performing a Ramsey interferometry to compare a RF frequency and a $^{14}$N zero-field splitting; entangling the NV electron spin and the nuclear spin, reading out a state of nuclear spins by collecting a fluorescence signal; calculating a frequency difference between the RF frequency and the $^{14}$N zero-field splitting according to the fluorescence signal, thereby locking the RF frequency to the $^{14}$N zero-field splitting; and outputting the RF frequency as a frequency standard.

10 Claims, 6 Drawing Sheets

(56) References Cited

U.S. PATENT DOCUMENTS

2014/0340085 A1  11/2014  Cappellaro et al.
2015/0358026 A1  12/2015  Gan
2017/0077665 A1*  3/2017  Liu .......................... H01S 1/005

* cited by examiner

IMPLEMENTATION METHOD AND DEVICE OF ATOMIC CLOCK BASED ON DIAMOND NV-$^{14}$N COUPLING SPIN SYSTEM

CROSS-REFERENCE TO RELATED APPLICATION

This application is a U.S. national phase filing under 35 U.S.C. § 371 of International Application No. PCT/CN2021/098720, filed on Jun. 7, 2021, entitled "IMPLEMENTATION METHOD AND APPARATUS FOR DIAMOND NV-$^{14}$N COUPLED SPIN SYSTEM-BASED ATOMIC CLOCK", the contents of which are hereby incorporated by reference in their entirety.

TECHNICAL FIELD

The present disclosure relates to a field of an atomic clock technology, and in particular, to a method for implementing an atomic clock based on NV-$^{14}$N coupling spin system in diamond and a device.

BACKGROUND

High-precision clocks are key technologies in many fields of technology and national defense, including communications, computing, navigation, etc. Atomic clocks measure time by monitoring the transition frequency of atoms, and are currently the most precise clock. The atomic clocks are mainly divided into two categories according to the used transition frequency, namely optical clocks and microwave clocks. The optical clocks calibrate a laser frequency using an optical transition frequency, which are the most precise atomic clocks at present. The precision of the optical clocks is three orders of magnitude higher than Cesium atomic clocks which are used for the definition of seconds. However, the setups of the optical clocks are so complicated that they have not been widely used yet. The microwave clocks calibrate a microwave frequency using an energy level splitting of a ground-state hyperfine coupling of atoms, such as Rubidium, Cesium, and Hydrogen, and the microwave clocks are the most widely used atomic clock.

The main technical indicators of the microwave atomic clocks include frequency accuracy, short-term stability, long-term stability, etc. In practical applications, the miniaturization and portability of atomic clock devices are also very important. For example, a spaceborne clock system, a communication network synchronization apparatus and other systems all require small atomic clocks with high precision. Mobile devices are generally not provided with high-precision clocks and must receive external signals (GPS signals) to calibrate their internal clocks, and when the external calibration signals are blocked, small atomic clocks are indispensable to perform the calibration. Additionally, in a laboratory, synchronizing numerous electronic devices also relies on small atomic clocks.

At present, small commercial atomic clocks are mainly Rubidium atomic clocks. The Rubidium clocks have the advantages of small size, low weight and low price, but the Rubidium clocks also have disadvantages such as low accuracy and poor long-term stability. Compared with atomic gases, the transition frequency of an atomlike defect in solids does not have Doppler broadening and collision broadening, and the stable environment in solids makes the transition frequency insensitive to external perturbations. If the transition frequency of the atomlike defect in solids is used as a frequency reference, the atomic clock devices with higher robustness are expected to be built due to the natural stable environment in solids. However, due to the complex lattice environment in solids, the coherence time of a solid-state spin is generally very short, and therefore there are few studies using the atomlike defect in solids as a frequency standard.

Nitrogen-vacancy (NV) defect center in diamond is a kind of point defect, and has excellent properties such as easy polarization, easy readout, and a long coherence time at room temperature, and therefore the research of this field has developed rapidly in the past decade. There is a method proposed to use a ground-state zero-field splitting of the NV center in diamond as a frequency standard to manufacture small atomic clocks. In principle, this solution may achieve a precision of commercial Rubidium atomic clocks. However, as the zero-field splitting of the NV center is greatly disturbed by temperature, a relationship with a change of temperature at room temperature is −74 kHz/K Therefore, due to the temperature instability, it is difficult to achieve a high precision of time and frequency by taking the zero-field splitting as a frequency standard.

SUMMARY

In view of the above problems, the present disclosure provides a method for implementing an atomic clock based on NV-$^{14}$N coupling spin system in diamond and a device.

The present disclosure provides a method for implementing an atomic clock based on NV-$^{14}$N coupling spin system in diamond, the method includes: comparing a RF frequency with a $^{14}$N zero-field splitting through Ramsey interferometry; reading out a difference value between the RF frequency and the $^{14}$N zero-field splitting by collecting a fluorescence signal from NV centers so as to feedback and lock the RF frequency, and outputting the RF frequency as a frequency standard. Such the method for implementing an atomic clock is also applicable to other high spin systems in solids. The high spin system here refers to a system having a spin larger than ½.

Further, the method for implementing an atomic clock based on NV-$^{14}$N coupling spin system in diamond of the present disclosure includes:
  initialization: applying a laser pulse to initialize NV electron spins, and applying a selective π microwave pulse and a π radiofrequency pulse to initialize $^{14}$N nuclear spins;
  Ramsey interferometry: performing a Ramsey interference sequence using π/2 radiofrequency pulses;
  readout: applying the selective π microwave pulse to entangle the nuclear spin and the electron spin, applying the laser pulse, simultaneously collecting the fluorescence signal from the NV centers, and converting the fluorescence signal into an electrical signal;
  frequency feedback and locking: calculating a frequency difference between the RF frequency and the $^{14}$N zero-field splitting according to the electrical signal, and adjusting the RF frequency according to a calculation result until the RF frequency is locked to the $^{14}$N zero-field splitting; and
  output: using a locked RF frequency as a frequency standard to output a clock signal of the atomic clock.

Further, in the method for implementing an atomic clock based on NV-$^{14}$N coupling spin system in diamond of the present disclosure, the initialization includes:
  applying the laser pulse to initialize the NV electron spins to $|m_S=0\rangle$, and applying the selective π microwave pulse and the π radiofrequency pulse to initialize the nuclear spins to $|m_I=0\rangle$; and applying the laser pulse to reinitialize the electron spins, so as to jointly initialize the NV electron spins and the $^{14}$N nuclear spins to a state $|m_S=0, m_I=0\rangle$.

Further, in the method for implementing an atomic clock based on NV-$^{14}$N coupling spin system in diamond of the present disclosure, the initialization process is performed multiple times to obtain an optimal polarization.

Further, in the method for implementing an atomic clock based on NV-$^{14}$N coupling spin system in diamond of the present disclosure, two states used for the Ramsey interferometry are $$|m_S = 0, m_I = 0\rangle,$$
and
$$\frac{1}{\sqrt{2}}(|m_S = 0, m_I = +1\rangle + |m_S = 0, m_I = -1\rangle)$$

which is a superposition state of the nuclear spin.

Further, in the method for implementing an atomic clock based on NV-$^{14}$N coupling spin system in diamond of the present disclosure, the RF frequency is calibrated through a proportional-integral-differential algorithm.

According to another aspect of the present disclosure, there provides an atomic clock device based on NV-$^{14}$N coupling spin system in diamond, including:
- a light source configured to emit a laser for exciting NV centers and causing the NV centers to emit a fluorescence;
- an optical filter configured to filter out a stray light outside a fluorescence spectrum;
- a microwave signal generator configured to generate a microwave;
- a radiofrequency signal generator configured to generate a radiofrequency;
- power amplifiers configured to increase a power of the microwave and a power of the radiofrequency, respectively;
- a double split-ring resonator configured to transmit the microwave to a spatial range of the laser-excited NV centers in diamond and form a uniform microwave field to manipulate electron spin states of the NVs;
- a radiofrequency coil configured to transmit the radiofrequency to the spatial range of the laser-excited NV centers in diamond and form a uniform radiofrequency field to manipulate nuclear spin states of $^{14}$Ns;
- a magnetic shield configured to shield a disturbance of an external magnetic field and improve stability and accuracy of the device;
- a photoelectric detector configured to collect a fluorescence signal radiated from the NV centers and convert fluorescence signal into an electrical signal;
- a frequency feedback and locking module configured to receive the electrical signal transmitted by the photoelectric detector, calculate a frequency difference between a RF frequency and a zero-field splitting of the $^{14}$N nuclear spins based on the electrical signal, feedback and control the RF frequency in real time according to the frequency difference, and lock the RF frequency to a $^{14}$N zero-field splitting;
- a sample module configured to provide the NV-$^{14}$N coupling spin systems, wherein a coherence time $T_2^*$ of the NV centers in the sample module is greater than 1 μs.

Further, the atomic clock device based on NV-$^{14}$N coupling spin system in diamond of the present disclosure includes: a fluorescence waveguide configured to collect and transmit the fluorescence emitted by the NV centers.

Further, the atomic clock device based on NV-$^{14}$N coupling spin system in diamond of the present disclosure includes: a Bragg reflector configured to be arranged around the diamond for forming an optical cavity, so as to improve an excitation efficiency of the NV center and reduce a requirement of a laser power.

Further, in the atomic clock device based on NV-$^{14}$N coupling spin system in diamond of the present disclosure, the number of NV centers of the sample module is greater than $10^{12}$.

A method for implementing an atomic clock based on NV-$^{14}$N coupling spin system in diamond and a device provided by the present disclosure have the following beneficial effects:

(1) The NV-$^{14}$N coupling spin system in diamond of the present disclosure is in stable solid environment and is not affected by environmental conditions such as an external magnetic field, electric field, and temperature. Therefore, the system has an excellent robustness, and a diamond atomic clock having a long-term high stability is expected to be implemented.

(2) In the atomic clock device based on NV-$^{14}$N coupling spin system in diamond of the present disclosure, various components may be integrated into several chips, and a miniaturized diamond atomic clock is expected to be implemented.

BRIEF DESCRIPTION OF THE DRAWINGS

The drawings are used to better understand the solution and do not constitute a limitation to the present disclosure.

In the drawings:
1. laser pulse; 2. microwave pulse; 3. radiofrequency pulse

DETAILED DESCRIPTION OF EMBODIMENTS

In order to make the objectives, technical solutions and advantages of the present disclosure more explicit, the principles and usage methods of the technical solutions of the present disclosure are described in detail as follows in combination with the specific embodiments and with reference to the accompanying drawings.

Nitrogen-vacancy defect (NV center) in diamond consists of a Nitrogen atom substituted for a Carbon atom and an adjacent vacancy, and a ground state $^3A_2$ of the negatively charged NV center is an electron spin with a spin number S=1. The electron spin has many excellent properties: the electron spin may be initialized with a laser, spin states of the electron spin may be read out by a fluorescence counting, a coherence manipulation may be performed by means of a microwave and a radiofrequency, and the electron spin has a long coherence time at a room temperature. Additionally, the electron spin of the NV center has a strong coupling with its own nitrogen nuclear spin, and may be used as a quantum resource to perform a task of quantum information processing. Such an NV-$^{14}$N coupling spin system is used in the present disclosure, and a measurement environment is a room temperature atmosphere.

The physical effects considered in the present disclosure include a zero-field splitting of an NV, a hyperfine interaction between an NV electron spin and a $^{14}$N nuclear spin, and a nuclear quadrupole coupling of $^{14}$N (i.e., $^{14}$N zero-field splitting). An NV electron wave function has $C_{3v}$ symmetry along the NV axis, defined as the z-axis. According to the $C_{3v}$ symmetry, a Hamiltonian of the nuclear quadrupole moment coupling of the $^{14}$N may be simplified to a form described by a nuclear quadrupole moment coupling constant P, as shown in equation (1):

$$H_{quad} = \frac{3Q}{4} I_z^2 \left\langle \frac{\partial^2 V(r)}{\partial z^2} \right\rangle_{r=r_N} = P I_z^2 \qquad (1)$$

where $I_z$ is a z component of the nuclear spin, $\langle \cdot \rangle$ represents an average value of an electron wave function, V(r) is an electrostatic potential produced by the NV electron at point r, and $$\left\langle \frac{\partial^2 V(r)}{\partial z^2} \right\rangle_{r=r_N}$$

is a zz component of an electric field gradient at a position $r^N$ of $^{14}$N. It should be noted that since the nuclear quadrupole moment coupling constant P is related to the electric field gradient (an external electric field gradient is generally small), and does not depend on an environmental variable such as a magnetic field, and electric field, it has extremely high stability and is suitable to be used as a frequency standard. Likewise, according to the $C_{3v}$ symmetry, a Hamiltonian of the hyperfine interaction between the NV electron spin and the $^{14}$N nuclear spin may be simplified in a form described by a longitudinal component A$_\parallel$ and a transverse component A$_\perp$, as shown in equation (2):

$$H_{hyper} = -\frac{\mu_0 \gamma_e \gamma_n \hbar^2}{4} \left[ \left\langle \frac{3(S \cdot \hat{n})(I \cdot \hat{n}) - S \cdot I}{|r - r_N|^3} \right\rangle + \frac{8\pi |\Phi_e(r_N)|^2}{3} S \cdot I \right] = \qquad (2)$$
$$A_\parallel S_Z I_Z + A_\perp (S_x I_x + S_y I_y)$$

where $\mu_0$ is a vacuum permeability, $\hbar$ is a reduced Planck constant, $\gamma_e$ and $\gamma_n$ are gyromagnetic ratios of the electron spin and the $^{14}$N nuclear spin, S=(S$_x$,S$_y$,S$_z$), I=(I$_x$, I$_y$, I$_z$) are spin operators, $\hat{n}$ is a unit vector along a |r–r$_N$| direction, and $|\Phi_e(r_N)|^2$ is an electron spin density at a $^{14}$N position. In summary, an entire Hamiltonian of an NV-$^{14}$N coupling quantum system is:

$$H_0 = H_\parallel + H_\perp \qquad (3)$$

$$H_\parallel = DS_z^2 + PI_z^2 + A_\parallel S_z I_z \qquad (4)$$

$$H_{195} = A_\perp (S_x I_x + S_y) \qquad (5)$$

where $H_\parallel$ is a principal term of the Hamiltonian, and $H_\perp$ is a perturbative term, which is noncommutable with the principal term. D≈2870 MHz is the zero-field splitting of NV.

Figure 1:
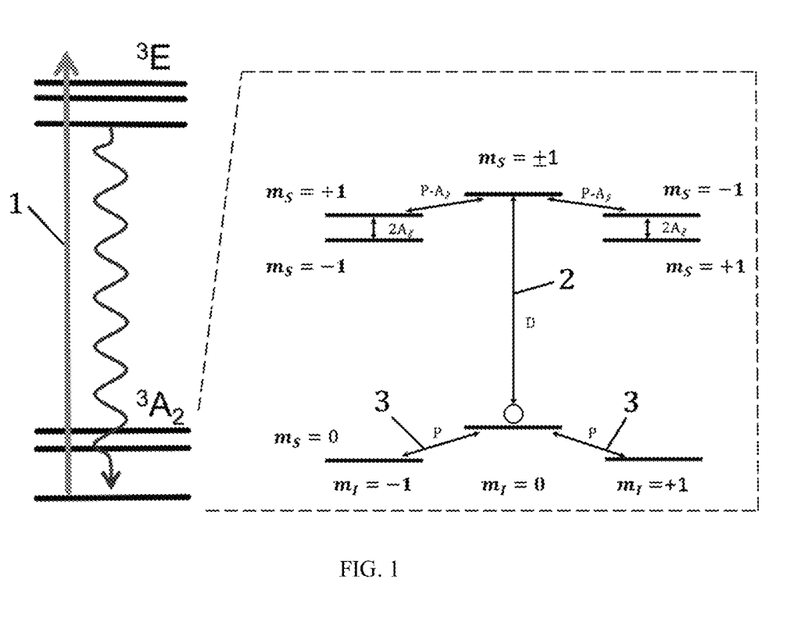
FIG. 1 shows an energy level structure diagram of an NV-$^{14}$N coupling spin system according to the present disclosure.

In the case of absence of an external magnetic field and ignoring a strain, the energy level structure of the NV-$^{14}$N coupling spin system is as shown in FIG. 1. A ground state $^3A_2$ thereof is a coupling spin system consist of the NV electron spin (S=1) and the $^{14}$N nuclear spin (I=1), which has 9 energy levels in total. Three energy levels within an electron spin subspace m$_s$=0 may be used as atomic clock states, and the other energy levels may be used to initialize and read out the nuclear spin. The system may be excited from the ground state $^3A_2$ to an excited state $^3E$ by applying a 532 nm laser pulse, thereafter the spin state m$_s$=±1 will reach an intermediate energy level with a high probability of non-radiation transition, and continue to return to the spin state m$_s$=0 from the intermediate energy level through the non-radiation process. Therefore, an NV electron spin initialization may be achieved by a laser pulse irradiation. Moreover, due to the non-radiation transition, a fluorescence intensity of the spin state m$_s$=±1 is lower than that of m$_s$=0 (by about 30%). Therefore, the spin state of NV may be read out by a fluorescence collection. In the present disclosure, a photoelectric detector is used to record a fluorescence intensity of NVs so as to read out the NV electron spins. Since the $^{14}$N nuclear spin may not be initialized by a laser and may not read out by the fluorescence, the $^{14}$N nuclear spin and the NV electron spin may be entangled by applying a selective $\pi$ microwave pulse and a $\pi$ radiofrequency pulse, so as to implement the initialization and readout of $^{14}$N nuclear spin.

The diamond used in the present disclosure is Ib or IIa type diamond, and the diamond may be prepared by a method of high temperature and high pressure (HPHT) or chemical vapor deposition (CVD). After an electron irradiation is performed on diamond, uniform vacancies are generated in diamond, then annealing is performed at above 600° C. to move the vacancies, and when the vacancies are captured by Nitrogen atoms, NV centers are formed. At present, an ideal productivity may exceed 50%, that is, more than half of the Nitrogen atoms may be combined with the vacancies to form the NV centers.

In the technical solution of the present disclosure, an ensemble of NV centers is used to reduce a statistical error of a frequency measurement, and simultaneously an external magnetic field is shielded, and a measurement is performed under a zero-field so as to eliminate the noise and line broadening resulting from problems such as the uniformity and stability of the magnetic field, and improve the stability and precision of the diamond atomic clock. A total measurement time is considered as T, in the case that NV centers of a number N are used, a relative frequency instability may be obtained by calculation as follows:

$$\frac{\delta f}{f_0} = \frac{1}{2\pi f_0 F \sqrt{T_2^* T} \sqrt{N}} \sim \frac{2 \times 10^{-5}}{\sqrt{T} \sqrt{N}} \qquad (6)$$

where f$_0$ is a center frequency, and is estimated to be about 5 MHz according to the nuclear quadrupole moment P, F is an NV center readout fidelity, and is about 1.5%, and T$_2$* is a coherence time of the nuclear spin, and is about 10 ms. However, the impurities around the NV centers may change the zero-field splitting P as well as the hyperfine interaction longitudinal component $A_\parallel$ of the $^{14}N$ nuclear spin and shorten the coherence time $T_2^*$ of the nuclear spin through a strain or an electric field effect. Considering the influence exerted by impurity Nitrogen atoms which are the most in diamond, as far as diamond having a Nitrogen concentration of about 1 ppm is concerned, a single quantum coherence time of the NV ensemble in diamond may reach about 10 μs. This means that the zero-field splitting of the NV centers has a Gaussian distribution, which has a standard deviation of about 20 kHz, and is generated from a strain gradient of a lattice. When a zero-field splitting deviation of two NV centers is about 300 kHz, the zero-field splitting P and the longitudinal components $A_\parallel$ of the NV-$^{14}N$ have a difference of several tens of Hertz. It may be supposed that for diamond having a Nitrogen concentration of about 1 ppm, a difference between the zero-field splitting P and the longitudinal component $A_\parallel$ of different NV-$^{14}N$s should be only several Hertz, while the Hertz level difference between the zero-field splitting P and the longitudinal component $A_\parallel$ will not shorten the coherence time $T_2^*$ of the nuclear spin. Therefore, theoretically a diamond atomic clock may be constructed using diamond having a Nitrogen concentration of about 10 ppm to achieve an optimal performance.

Figure 2:
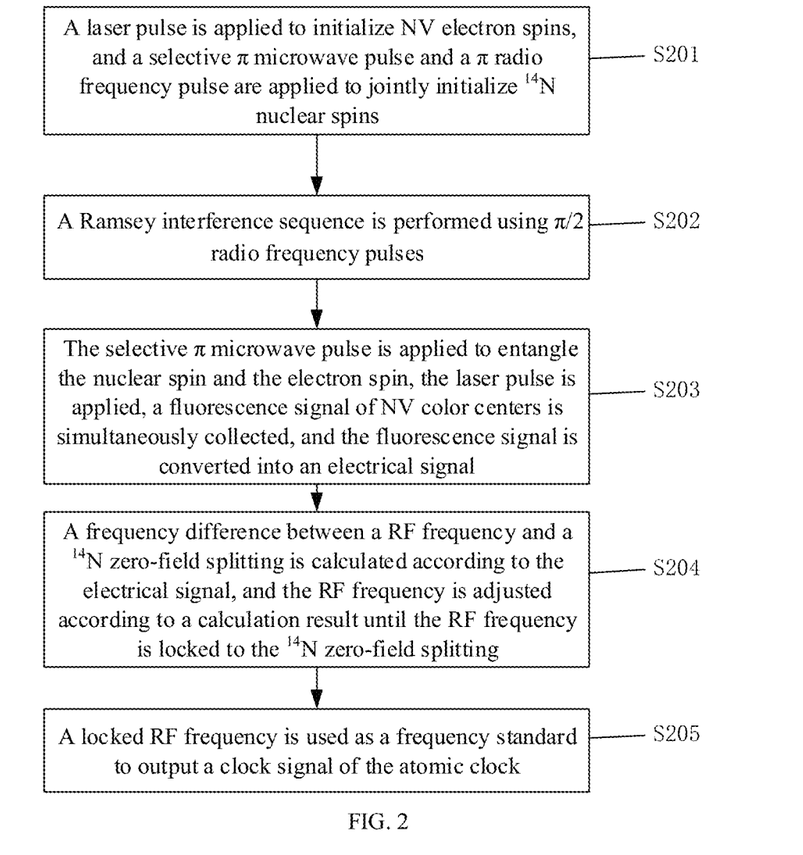
FIG. 2 shows a flow chart of a method for implementing an atomic clock according to the present disclosure.

As shown in FIG. 2, the method for implementing an atomic clock according to the present disclosure includes:

S201, initialization: applying a laser pulse to initialize NV electron spins, and then applying a selective π microwave pulse and a π radiofrequency pulse to initialize $^{14}N$ nuclear spins;

S202, Ramsey interferometry: performing a Ramsey interference sequence using π/2 radiofrequency pulses;

S203, readout: applying the selective π microwave pulse to entangle the nuclear spin and the electron spin, applying the laser pulse, simultaneously collecting a fluorescence signal at NV centers, and converting the fluorescence signal into an electrical signal;

S204, frequency feedback and locking: calculating a frequency difference between a RF frequency and a $^{14}N$ zero-field splitting according to the electrical signal, and adjusting the RF frequency according to a calculation result until the RF frequency is locked to the $^{14}N$ zero-field splitting;

S205, output: using a locked RF frequency as a frequency standard to output a clock signal of the atomic clock.

Figure 3:
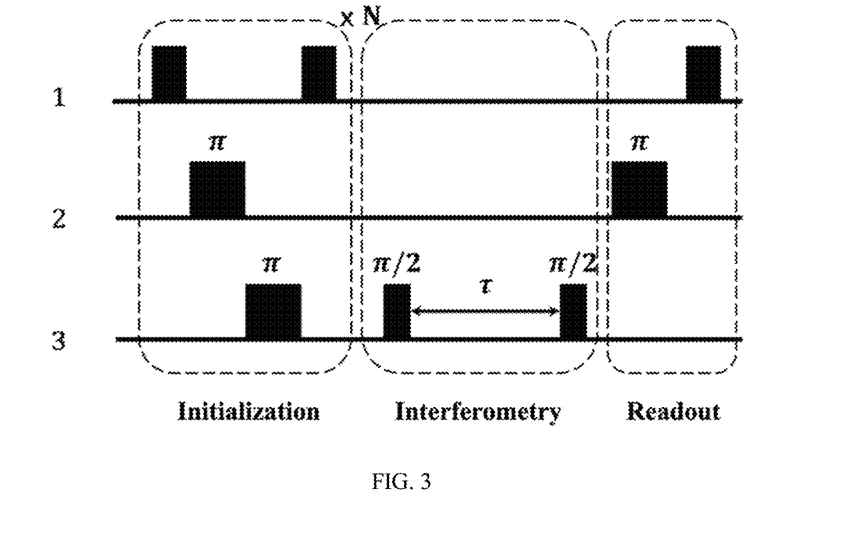
FIG. 3 shows a schematic diagram of a sequence of laser pulses, microwave pulses and radiofrequency pulses according to the present disclosure.

FIG. 3 shows a schematic diagram of a sequence of laser pulses, microwave pulses and radiofrequency pulses according to the present disclosure. A laser pulse 1 is configured to initialize and read out NV electron spins, and a laser pulse of 520-550 nm, preferably 532 nm is used in the present disclosure. A microwave pulse 2 is used to flip a state $$|m_S = 0, m_I = 0> \text{ to a state } \frac{1}{\sqrt{2}}(|m_S = +1, m_I = 0> + |m_S = -1, m_I = 0>),$$

and a selective π pulse is used in the present disclosure. A RF pulse 3 is used for a coherent manipulation between a state $$|m_s = 0, m_I =$$

-continued
$$0> \text{ and a state } \frac{1}{\sqrt{2}}(|m_S = 0, m_I = +1> + |m_S = 0, m_I = -1>),$$

and the present disclosure includes a π pulse and a π/2 pulse. According to a correspondence of reference signs 1, 2, and 3, the spin state manipulated by the pulse in FIG. 3 may be found in FIG. 1.

Figure 4:
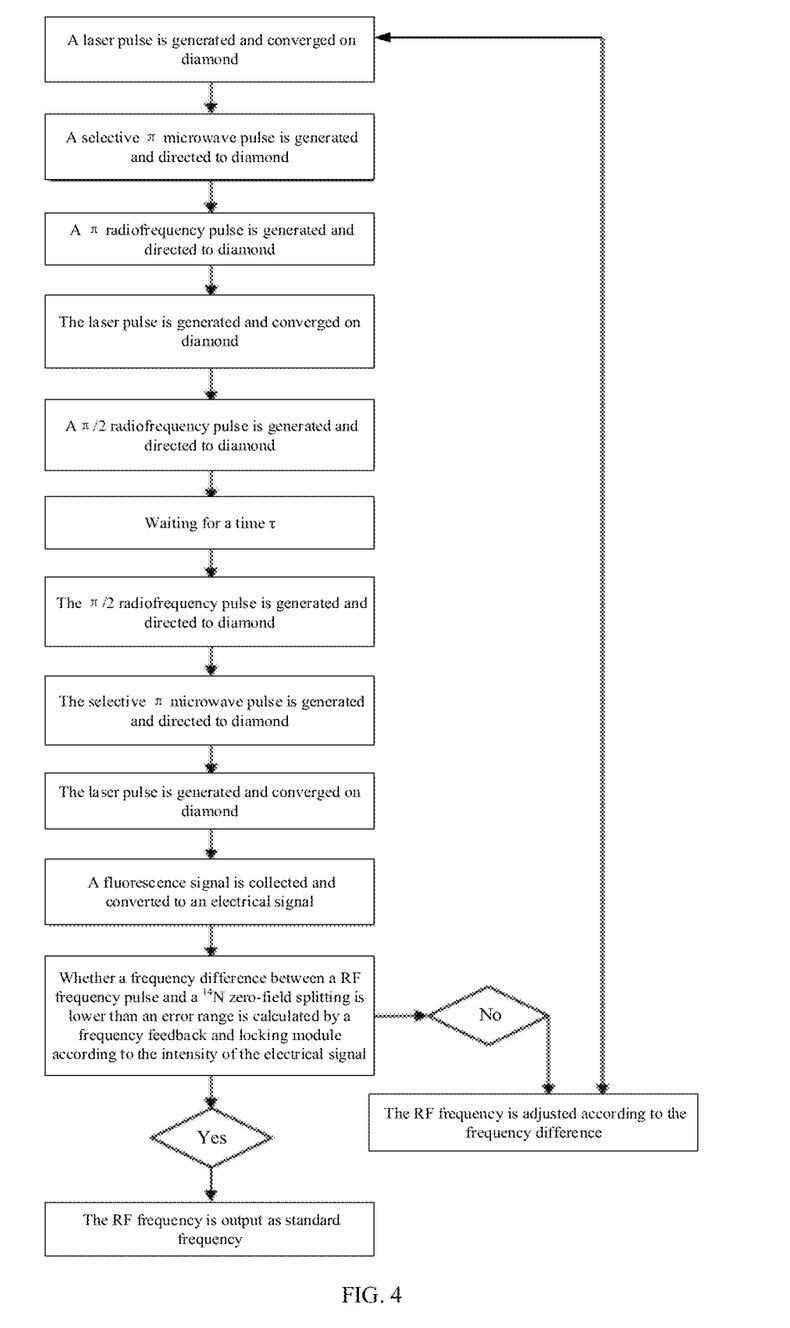
FIG. 4 shows a flow chart of a specific solution according to an embodiment of the present disclosure.

Referring to FIG. 4, a specific solution according to an embodiment of the present disclosure is described as follows.

In initialization step, a laser pulse of 532 nm is applied to initialize the NV electron spins to $|m_s=0>$, and a selective π microwave pulse and a π radiofrequency pulse are applied to initialize the nuclear spins to $|m_I=0>$. Here, regardless of whether the initial state of the nuclear spins is $|m_I=+1>$ or $|m_I=-1>$, the nuclear spins may be shifted to $|m_I=0>$, because the two states are degenerate in an absence of an external magnetic field. The laser pulse of 532 nm is applied to initialize the electron spins again, and in this way, the NV electron spins and the $^{14}N$ nuclear spins are jointly initialized to a state $|m_s=0, m_I=0>$. Due to an imperfect manipulation and an existence of an NV neutral charge state, a single initialization process may not achieve a maximum polarization of the nuclear spins. Therefore, the above whole initialization process may be performed multiple times to achieve an optimal polarization.

In Ramsey interferometry step, similar to a method of the conventional atomic clock, a Ramsey interference sequence is performed using π/2 radiofrequency pulses, but the difference is that three energy levels are involved in the present embodiment. Although three energy levels are involved, since the other two energy levels are degenerate, there are actually two states. This is consistent with the conventional Ramsey interferometry, except that one of the states is a superposition state of two energy levels. Therefore, in the present embodiment, two states used in the Ramsey interferometry are $$|m_S = 0, m_I = 0>,$$

and $$\frac{1}{\sqrt{2}}(|m_S = 0, m_I = +1> + |m_S = 0, m_I = -1>)$$

which is a superposition state of a nuclear spin, and an energy level difference between the energy levels is a zero-field splitting P of the $^{14}N$ nuclear spin. A time τ between two π/2 pulses is a coherence evolution time for comparing a RF frequency with the zero-field splitting P. In a specific embodiment, an optimal value of τ should be selected to enable a highest sensitivity of the device. Therefore, the coherence time of the nuclear spin $T_2^* \sim 10$ ms is taken as τ in the present embodiment.

In readout step, a state of the nuclear spins is a result of the Ramsey interferometry. As the state of nuclear spins may not be directly read out by a fluorescence, the selective π microwave pulse is applied to entangle the nuclear spin and the electron spin. Then, the laser pulse is applied and simultaneously a photoelectric detector is turned on to collect a fluorescence signal from the NV centers to read out the state of electron spins, that is, the state of nuclear spins is read out. The photoelectric detector converts the fluorescence signal into an electrical signal, and the electrical signal is further used for a real-time feedback to calibrate the RF frequency.

In frequency feedback and locking step, the RF signal is fed back and controlled according to the electrical signal, which is converted from the fluorescence signal and may also be referred to as a measurement signal of Ramsay interferometry, and the RF frequency is locked to the $^{14}$N zero-field splitting in real time. Specifically, a frequency difference value between the RF frequency and the $^{14}$N zero-field splitting is calculated according to the electrical signal converted from the fluorescence signal. If the frequency difference value obtained by calculation is within an error range, a frequency of a RF generator is not adjusted. If the frequency difference value obtained by calculation is not within the error range, this means that the RF frequency is offset, the frequency of the RF generator is adjusted, and the step is turned back to the initialization for a new start until the frequency difference value is within the error range, so that the RF frequency is locked to the $^{14}$N zero-field splitting in real time. The error range may be set as a standard deviation obtained by testing an output RF frequency of the atomic clock before working of the atomic clock. A difference value between the $^{14}$N zero-field splitting value and the RF frequency is calculated using the electrical signal. The specific calculation method is as follows: the RF frequency is set to be $^{14}$N zero-field splitting before working of the atomic clock work, a measurement of Ramsey interferometry is performed, a frequency sweeping is performed in a small range to obtain corresponding measurement signal of Ramsey interferometry and a ratio between a frequency difference value and an intensity change value of the electrical signal, and thereby a difference value between the $^{14}$N zero-field splitting and the RF frequency may be calculated by multiplying the intensity change value of the electrical signal during working of the atomic clock by the ratio. In some embodiments, better algorithms may be used for feedback. For example, a RF frequency is calibrated through a proportional-integral-derivative algorithm (PID algorithm) using a currently measured frequency difference value with multiple previously measured data. Specifically, a frequency control parameter is formed in a proportional-integral-derivative control process according to an estimated frequency difference value, and the frequency control parameter is fed back to a frequency feedback and locking module as the feedback input so as to lock the RF frequency.

Figure 5:
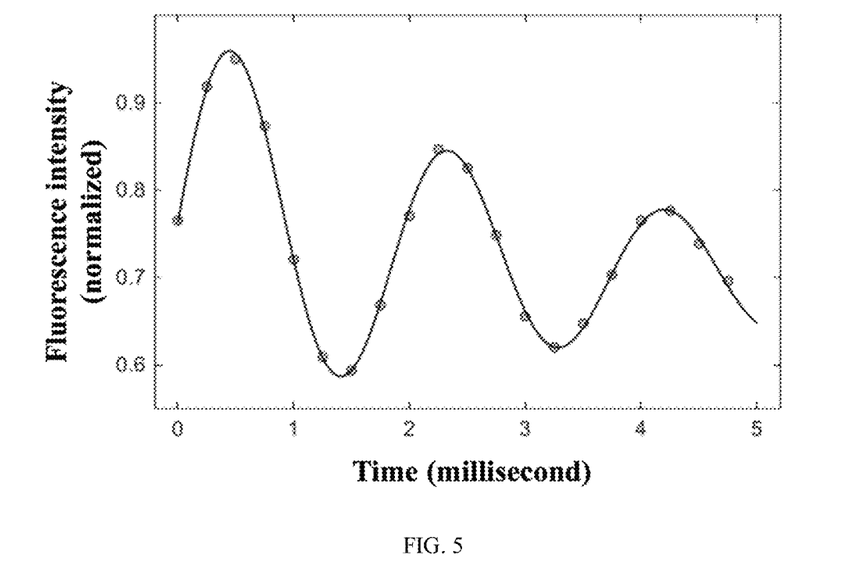
FIG. 5 shows an interference pattern measured by a single NV-$^{14}$N coupling spin system.

The interference pattern measured by a single NV-$^{14}$N coupling spin system is as shown in FIG. 5. The horizontal axis is a time interval $\tau$ of a black pulse, the vertical axis is the number of normalized NV photons, and the black line is a curve obtained by fitting the experimental data with a function $[\alpha \sin(2\pi(\delta f)t+\varphi)+b]e^{-(t/T_2^*)^p}+c$, where $\delta f$ represents a detuning. The test is performed at a magnetic field strength of about 510 Gauss, at which the Zeeman effect of the NV electron spin and the $^{14}$N nuclear spin as well as the excited state level anticrossing (ESLAC) effect need to be considered. The experiment result measured by interference in the single NV-$^{14}$N coupling spin system verifies the feasibility of the technical solution in the present disclosure. The difference between this experiment and the technical solution of constructing an atomic clock using ensemble NV centers in the present disclosure lies in the number of centers and the magnetic field environment. In the specific embodiments, an optimal $\tau$ value is selected to measure the result of the Ramsey interferometry at a single point.

Figure 6:
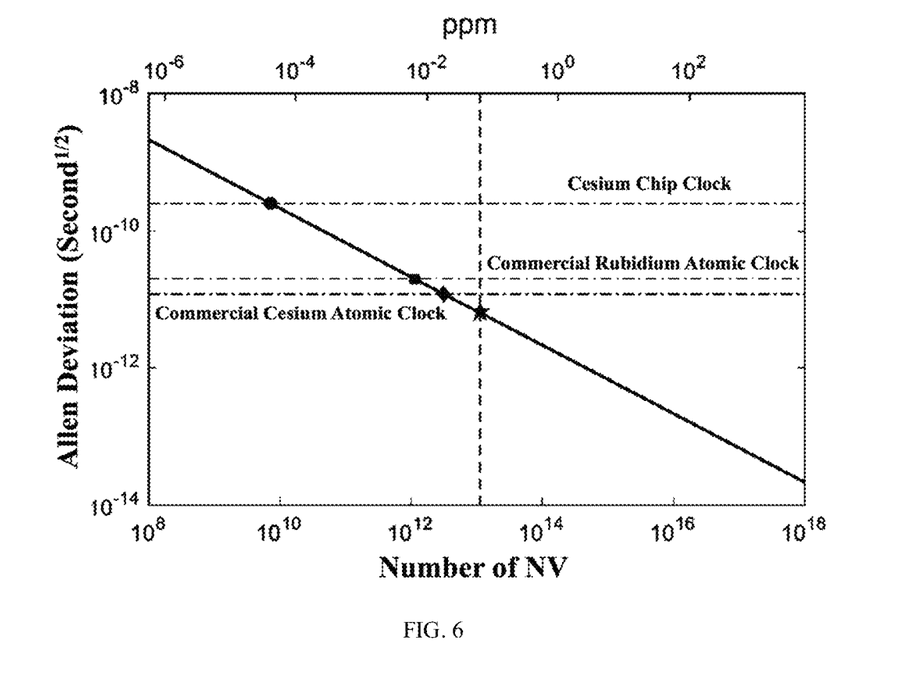
FIG. 6 shows a comparison diagram of a frequency instability between an embodiment of the present disclosure and a commercial atomic clock.

FIG. 6 is a comparison diagram of a frequency instability between an embodiment of the present disclosure and a commercial atomic clock, and shows relative frequency instability $\delta f \sqrt{T}/f_0$ of an ensemble NV centers at an integration time of 1 second and a comparison with three commercial atomic clocks. The solid line is obtained by calculation according to equation (6), where a horizontal axis thereof is the number of NV centers (bottom) and a corresponding density of the NV centers (for diamond having a volume of 1 mm$^3$) (top). By comparison, relative frequency instability of a Cesium chip clock (Cs Chip Clock) is $2.5 \times 10^{-10}$, that of a commercial Rubidium atomic clock (Commercial Rb) is $2 \times 10^{-11}$, and that of a commercial Cesium atomic clock (Commercial Cs) is $1.2 \times 10^{-11}$. It may be seen from FIG. 6 that a diamond atomic clock having $10^{12}$ NV centers may reach a level of a commercial atomic clock.

Figure 7:
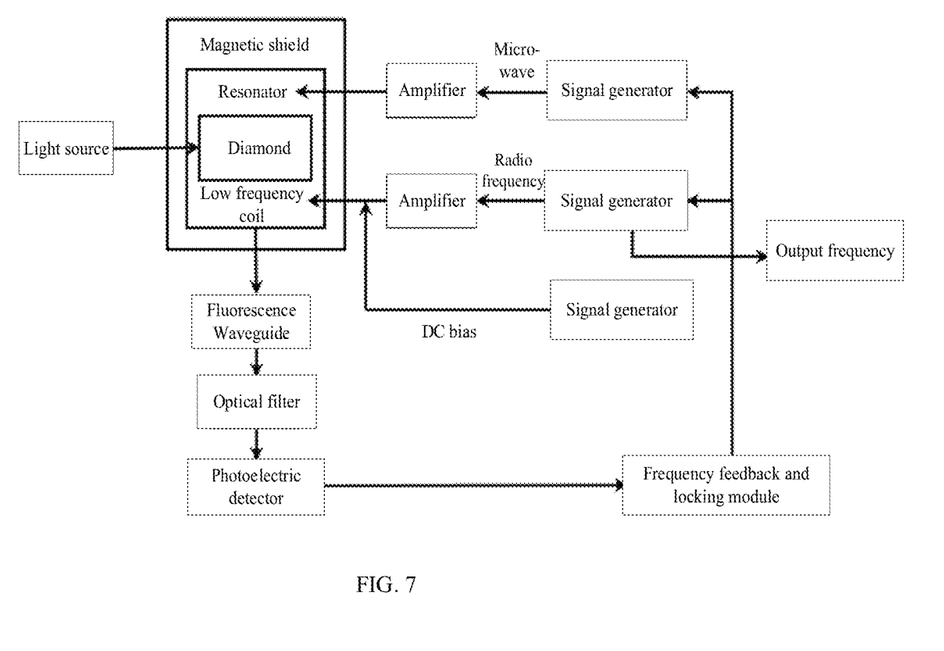
FIG. 7 shows a diagram of a diamond atomic clock device according to an embodiment of the present disclosure.

FIG. 7 shows a diamond atomic clock device according to an embodiment of the present disclosure, and the device includes an optical path module, a microwave and radiofrequency module, a signal collecting module, a frequency feedback and locking module and a sample module.

The optical path module includes a light source that is quickly switchable, a fluorescence waveguide, and an optical filter.

The light source is configured to emit a laser for exciting NV centers and causing the NV centers to emit a fluorescence. In the present embodiment, the light source is configured to be a fiber laser of 532 nm. In some embodiments, it may also be configured to be a laser light source for generating a laser of 520-550 nm. In some embodiments where compact structures are considered, the light source may also be a vertical cavity surface emitting laser of 520 nm.

The fluorescence waveguide is configured to collect and transmit a fluorescence emitted by the NV centers. For some embodiments where compact structures are provided, a fluorescence waveguide may not be configured.

The optical filter is configured to filter out a stray light outside a fluorescence spectrum. In the present embodiment, the optical filter is configured to be a band-pass filter set of 590-800 nm.

In some embodiments, the optical path module may further include a distributed Bragg reflector of 532 nm, and the Bragg reflector is configured to be arranged around the diamond for forming an optical cavity, so as to improve excitation efficiency of the NV centers and reduce requirements of a laser power.

The microwave and radiofrequency module includes a microwave signal generator, a RF signal generator, power amplifiers, a double split-ring resonator loaded with a diamond sample, a radiofrequency coil, and a magnetic shield.

The microwave signal generator and the RF signal generator are respectively configured to generate a microwave and a radiofrequency.

The power amplifiers are configured to increase a power of the microwave and a power of the radiofrequency, respectively.

The double split-ring resonator transmits the microwave to a spatial range of the laser-excited NV centers in diamond and forms a uniform microwave field to manipulate electron spin states of NVs.

The radiofrequency coil transmits the radiofrequency to the spatial range of the laser-excited NV centers in diamond and forms a uniform radiofrequency field to manipulate nuclear spin states of $^{14}$Ns.

The magnetic shield is configured to shield a disturbance of an external magnetic field and improve stability and accuracy of the device. An influence of a spin Zeeman effect may be eliminated by constructing a diamond atomic clock in a zero-field with the external magnetic field shielding.

The signal collecting module includes a photoelectric detector, and the photoelectric detector is configured to collect a fluorescence signal radiated from the NV centers and convert the fluorescence signal into an electrical signal. The fluorescence signal corresponds to a result of the Ramsey interferometry. In the present embodiment, the photoelectric detector is configured to be a combination of a photodiode (PD) and an amplifying circuit.

The frequency feedback and locking module is configured to receive the electrical signal transmitted by the photoelectric detector, calculate a frequency difference between a RF frequency and a zero-field splitting of $^{14}$N nuclear spins based on the electrical signal, feedback and control the RF frequency in real time according to the frequency difference, and lock the RF frequency to the $^{14}$N zero-field splitting, thereby calibrating the RF frequency in real time.

In some embodiments, the frequency feedback and locking module further includes a proportional-integral-derivative controller (PID controller) configured to form a frequency control parameter in a proportional-integral-derivative control process according to an estimated frequency difference value, and feedback the frequency control parameter to the frequency feedback and locking module as a feedback input.

The sample module of the present disclosure is configured to provide the NV-$^{14}$N coupling spin systems. In the sample module of the present embodiment, a diamond sample grown by CVD (Chemical Vapor Deposition) is used. After an electron irradiation is performed on the diamond, annealing is performed at a high temperature to generate NV centers, and the NV centers are located in a bulk diamond. More generally, a coherence time $T_2^*$ of the NV centers in the sample module in the technical solution of the present disclosure needs to be greater than 1 μs to implement the selective π microwave pulse in FIG. 2. Additionally, the number of the NV centers inside the diamond should be greater than $10^{12}$ so as to improve precision and obtain a comparable performance to a commercial atomic clock. Therefore, in the present embodiment, for diamond having a volume of 1 mm$^3$, an NV concentration should be greater than 6 ppb. Considering factors such as excitation efficiency and uniformity of a radiation field of the optical path module, a diamond sample having a dimension of about 1×1×0.1 mm$^3$ and an NV concentration of about 1 ppm is selected in the present embodiment, and the number of the NVs is about $10^{13}$, corresponding to the number of the NVs indicated by asterisks in FIG. 6.

The NV-$^{14}$N coupling spin system in diamond of the present disclosure is located in a stable solid environment and is not affected by environmental conditions such as an external magnetic field, and electric field, and therefore the system has an excellent robustness and a diamond atomic clock having a long-term high stability is expected to be implemented in such a system.

In the atomic clock device based on the above system, various components may be integrated into several chips, and a miniaturized diamond atomic clock is expected to be implemented.

The specific embodiments described above further illustrate the objects, technical solutions and beneficial effects of the present disclosure in detail. It should be understood that the above descriptions are only specific embodiments of the present disclosure and are not construed as limiting the present disclosure. Any modifications, equivalent replacements and improvements made within the spirit and principles of the present disclosure shall be contained in the scope of protection of the present disclosure.

What is claimed is:

1. A method for implementing an atomic clock based on NV-$^{14}$N coupling spin system in diamond, the method comprising: comparing a RF frequency with a $^{14}$N zero-field splitting through Ramsey interferometry; reading out a difference value between the RF frequency and the $^{14}$N zero-field splitting by collecting a fluorescence signal at NV centers so as to feedback and lock the RF frequency, and outputting the RF frequency as a frequency standard.

2. The method according to claim 1, comprising:
   initialization: applying a laser pulse to initialize NV electron spins, and applying a selective π microwave pulse and a π radiofrequency pulse to initialize $^{14}$N nuclear spins;
   Ramsey interferometry: performing a Ramsey interference sequence using π/2 radiofrequency pulses;
   readout: applying the selective π microwave pulse to entangle the nuclear spin and the electron spin, applying the laser pulse, simultaneously collecting the fluorescence signal from the NV centers, and converting the fluorescence signal into an electrical signal;
   frequency feedback and locking: calculating a frequency difference between the RF frequency and the $^{14}$N zero-field splitting according to the electrical signal, and adjusting the RF frequency according to a calculation result until the RF frequency is locked to the $^{14}$N zero-field splitting;
   output: using a locked RF frequency as a frequency standard to output a clock signal of the atomic clock.

3. The method according to claim 2, wherein the initialization comprises:
   applying the laser pulse to initialize the NV electron spins to $|m_s=0>$, applying the selective π microwave pulse and the π radiofrequency pulse to initialize the nuclear spins to $|m_I=0>$; and
   applying the laser pulse to reinitialize the electron spins, so as to jointly initialize the NV electron spins and the $^{14}$N nuclear spins to a state $|m_s=0, m_I=0>$.

4. The method according to claim 2, wherein the initialization process is performed multiple times to obtain an optimal polarization.

5. The method according to claim 2, wherein two states used for the Ramsey interferometry are $$|m_S = 0, m_I = 0>,$$

$$\text{and } \frac{1}{\sqrt{2}}(|m_S = 0, m_I = +1> + |m_S = 0, m_I = -1>)$$

which is a superposition state of the nuclear spin.

6. The method according to claim 2, wherein the RF frequency is calibrated through a proportional-integral-differential algorithm.

7. An atomic clock device based on NV-$^{14}$N coupling spin system in diamond, comprising:
   a light source configured to emit a laser for exciting NV centers and causing the NV centers to emit a fluorescence;
   an optical filter configured to filter out a stray light outside a fluorescence spectrum;
   a microwave signal generator configured to generate a microwave;
   a radiofrequency signal generator configured to generate a radiofrequency;

power amplifiers configured to increase a power of the microwave and a power of the radiofrequency, respectively;

a double split-ring resonator configured to transmit the microwave to a spatial range of the laser-excited NV centers in diamond and form a uniform microwave field to manipulate electron spin states of NVs;

a radiofrequency coil configured to transmit the radiofrequency to the spatial range of the laser-excited NV centers in diamond and form a uniform radiofrequency field to manipulate nuclear spin states of $^{14}$Ns;

a magnetic shield configured to shield a disturbance of an external magnetic field and improve stability and accuracy of the device;

a photoelectric detector configured to collect a fluorescence signal radiated from the NV centers and convert the fluorescence signal into an electrical signal;

a frequency feedback and locking module configured to receive the electrical signal transmitted by the photoelectric detector, calculate a frequency difference between a RF frequency and a zero-field splitting of $^{14}$N nuclear spins based on the electrical signal, feedback and control the RF frequency in real time according to the frequency difference, and lock the RF frequency to the $^{14}$N zero-field splitting; and a sample module configured to provide NV-$^{14}$N coupling spin systems, wherein a coherence time $T_2^*$ of the NV centers in the sample module is greater than 1 μs.

8. The atomic clock device according to claim 7, comprising: a fluorescence waveguide configured to collect and transmit the fluorescence emitted by the NV centers.

9. The atomic clock device according to claim 7, comprising: a Bragg reflector configured to be arranged around the diamond for forming an optical cavity, so as to improve an excitation efficiency of the NV centers and reduce a requirement of a laser power.

10. The atomic clock device according to claim 7, wherein the number of NV centers of the sample module is greater than $10^{12}$.

* * * * *